United States Patent
Uehara et al.

(10) Patent No.: US 9,650,986 B2
(45) Date of Patent: May 16, 2017

(54) CYLINDER FOR APPLICATION ON AN INTERNAL COMBUSTION ENGINE

(71) Applicants: Mahle-Metal Leve S/A, Jindiai (BR); Mahle International GmbH, Stuttgart (DE)

(72) Inventors: Samantha Uehara, Sao Paulo (BR); Paulo Jose Da Rocha Mordente, Jundiai (BR); Edney Deschauer Rejowski, Jundiai (BR)

(73) Assignees: MAHLE Metal Leve S.A., Jundiai (BR); MAHLE International GmbH, Stuttgart (DE)

( * ) Notice: Subject to any disclaimer, the term of this patent is extended or adjusted under 35 U.S.C. 154(b) by 127 days.

(21) Appl. No.: 14/403,633

(22) PCT Filed: May 24, 2013

(86) PCT No.: PCT/BR2013/000178
§ 371 (c)(1),
(2) Date: Nov. 25, 2014

(87) PCT Pub. No.: WO2013/173896
PCT Pub. Date: Nov. 28, 2013

(65) Prior Publication Data
US 2015/0176518 A1  Jun. 25, 2015

(30) Foreign Application Priority Data

May 25, 2012  (BR) .............................. 102012012636

(51) Int. Cl.
*F02F 1/00* (2006.01)
*F02F 1/18* (2006.01)
(Continued)

(52) U.S. Cl.
CPC ............ *F02F 1/18* (2013.01); *C23C 16/0254* (2013.01); *C23C 16/26* (2013.01); *C23C 30/00* (2013.01); *F02F 1/004* (2013.01); *F02F 1/20* (2013.01)

(58) Field of Classification Search
CPC .......... F16J 9/26; F16J 10/04; C23C 14/0605; C23C 16/26; C23C 28/046; C23C 28/044;
(Continued)

(56) References Cited

U.S. PATENT DOCUMENTS 3,768,344 A * 10/1973 Feldcamp ................ B23H 1/04
219/69.17
5,592,840 A * 1/1997 Miyasaka ................ C21D 7/06
29/90.7

(Continued)

FOREIGN PATENT DOCUMENTS

CN       100529374 C    8/2009
DE   102009046281 B3   11/2010
(Continued)

OTHER PUBLICATIONS

English abstract for JP2006-283970.
(Continued)

*Primary Examiner* — Marguerite McMahon
*Assistant Examiner* — Tea Holbrook
(74) *Attorney, Agent, or Firm* — Alston & Bird LLP

(57) ABSTRACT

A cylinder for an internal combustion engine may include a metallic cylinder body and an amorphous diamond-like hard carbon film disposed on an internal peripheral surface of the cylinder body. The amorphous diamond-like carbon film may include a roughness ranging from Rz 0.5 μm to Rz 4.0 μm.

14 Claims, 5 Drawing Sheets

(51) Int. Cl.
*C23C 16/02* (2006.01)
*C23C 16/26* (2006.01)
*C23C 30/00* (2006.01)
*F02F 1/20* (2006.01)

(58) Field of Classification Search
CPC ..... C23C 28/343; C23C 4/02; C23C 16/0254; C23C 30/00; F02F 1/004; F02F 1/18; F02F 1/20
See application file for complete search history.

(56) References Cited

U.S. PATENT DOCUMENTS

| | | | |
|---|---|---|---|
| 6,491,987 B2* | 12/2002 | Veerasamy | B32B 17/10577 427/165 |
| 7,427,439 B2* | 9/2008 | Saito | C23C 16/029 428/336 |
| 8,039,108 B2* | 10/2011 | Sato | C23C 14/025 427/577 |
| 2004/0255882 A1* | 12/2004 | Branyon | F02B 33/22 123/70 R |
| 2004/0263855 A1* | 12/2004 | Segall | G01N 21/8806 356/446 |
| 2005/0064196 A1* | 3/2005 | Martin | C10M 169/04 428/408 |
| 2005/0142250 A1* | 6/2005 | Garwood | A23B 4/00 426/35 |
| 2006/0048386 A1* | 3/2006 | Boehm | C23C 4/02 29/888.06 |
| 2008/0053396 A1* | 3/2008 | Hiraishi | F16J 9/00 123/193.2 |
| 2008/0146468 A1* | 6/2008 | Konishi | C10M 169/04 508/109 |
| 2009/0011252 A1* | 1/2009 | Stein | C23C 16/0272 428/446 |
| 2009/0118148 A1* | 5/2009 | Martin | C10M 105/14 508/109 |
| 2009/0311443 A1* | 12/2009 | Boardman | C23C 16/045 427/569 |
| 2010/0219506 A1* | 9/2010 | Gupta | B23K 26/0084 257/618 |
| 2010/0272931 A1* | 10/2010 | Stavlid | B24B 1/00 428/34.1 |
| 2010/0319647 A1* | 12/2010 | Ogawa | C22C 21/00 123/193.2 |
| 2011/0044572 A1 | 2/2011 | Kano et al. | |
| 2011/0252899 A1* | 10/2011 | Felts | C23C 16/045 73/865.8 |
| 2012/0227699 A1* | 9/2012 | Perry | C22C 21/02 123/193.4 |
| 2012/0318228 A1* | 12/2012 | Aharonov | C23C 16/509 123/193.2 |
| 2013/0042845 A1* | 2/2013 | Kennedy | C23C 16/0272 123/668 |
| 2013/0155517 A1* | 6/2013 | Park | G02B 5/0221 359/599 |

FOREIGN PATENT DOCUMENTS

| | | |
|---|---|---|
| EP | 1510594 A2 | 3/2005 |
| EP | 1783349 A1 | 5/2007 |
| JP | 2006-283970 A | 10/2006 |
| WO | WO 2009/099226 A1 | 8/2009 |
| WO | WO-2012/106791 A1 | 8/2012 |

OTHER PUBLICATIONS

English abstract for EP-1783349.
International Search Report for PCT/BR2013/000178, dated Oct. 21, 2013.
State Intellectual Property Office of the P.R.C., Search Report for Application No. 201380037774.5, Feb. 1, 2016, 1 page.
State Intellectual Property Office of the P.R.C., First Office Action for Application No. 201380037774.5, Feb. 29, 2016, 8 page.
State Intellectual Property Office of the P.R.C., Notification to Grant Patent Right for Application No. 201380037774.5, Oct. 11, 2016, 3 page.
European Patent Office, Communication pursuant to Article 94(3) EPC for Application No. 13736463.4, Dec. 13, 2016, 4 pages, Germany.
International Searching Authority (ISA), Written Opinion for International Application No. PCT/BR2013/000178, Oct. 21, 2013, 7 pages, European Patent Office, Germany.
International Preliminary Examining Authority, International Preliminary Report on Patentability (Chapter II), including Applicant's Aug. 8, 2014 Response to the ISA's Written Opinion, for International Application No. PCT/BR2013/000178, Nov. 20, 2014, 27 pages, European Patent Office, Germany.

* cited by examiner

US 9,650,986 B2

CYLINDER FOR APPLICATION ON AN INTERNAL COMBUSTION ENGINE

CROSS REFERENCE TO RELATED APPLICATIONS

This application is a US National Phase Application of PCT/BR2013/000178, filed on May 24, 2013, which claims priority to Brazilian Patent Application No. BR-102012012636-2, filed on May 25, 2012, the contents of which are both hereby incorporated by reference in their entirety.

TECHNICAL FIELD

The present invention relates to a component of an internal combustion engine, more specifically a cylinder comprising a cylindrical body of metallic base, the internal peripheral surface of which receives a hard carbon film providing specific roughness with a view to minimize losses by friction and wear of the component.

BACKGROUND

As a result of the new demands of the market, components of internal combustion engine undergo greater demands and so they need to exhibit solutions capable of guaranteeing better performance, as well as to contribute to greater reliability and performance of the engine.

Additionally, the whole production chain of the world automobile industry has been challenged by the need to reduce atmospheric emissions generated by the burning of fossil fuels.

Thus, a number of makers of automotive components seek different technical solutions, chiefly for cylinders of internal combustion engines, among others. It should be noted that cylinders of internal combustion engines comprise both the cylinder liner applied to an engine block and the cylinders that are formed integrally with the engine block itself. For better understanding, only the term "cylinder" will be used from now on to define any of the possibilities mentioned.

Regardless of the technical solution, cylinders of internal combustion engine are engine components that undergo significant wear due to the type of work which they perform. This characteristic, coupled to the growing challenges for the automobile industry, result in the need to work with lower dimension tolerances, greater work pressures, more corrosive conditions, which result in effects on an engine component that have to be solved. It should be further noted that, in the case of engines that operate with Diesel cycle, this type of wear is quite high, particularly due to the presence of the sulfur element in the Diesel fuel.

Thus, the possible solutions that enable one to improve the performance of engines subjected to said conditions can be achieved through the improvement of the material used for producing cylinders, always taking into consideration the cost of such a solution. In this regard, there are some advances, markedly in the case of cylinders comprising ferrous alloys.

The main alloys applied in producing cylinder liners of the prior art are ferrous alloys. Among them, one can cite gray cast iron, which exhibits a reduced cost and, mainly, excellent tribological characteristics due to the presence of a large amount of solid lubricant, in the form of graphite, on the slide surface. Anyway, this material does not enable additional reduction of loses by friction or reduction of wear, which the present-day conditions require.

Document EP 1783349 discloses a solution for various internal components of engines, among which are cylinders, which enables a low friction coefficient. For this purpose, the internal peripheral surface of a metallic cylinder body receives a hard carbon film by chemical vapor deposition (CVD), the hard carbon film being provided with the silicon element in an amount ranging from 1% to 20%, that is, the cylinder work surface comprises an amount of silicon that may range from 1% to 20%. Moreover, said film has thickness ranging from 2 µm and 5 µm, and the roughness should be lower than Rz 0.5 µm.

Even though the proposed solution exhibits characteristics that result in a low friction coefficient and good wear resistance, there is a great drawback. The low roughness achieved (lower than 0.5 Rz) imparts to the cylinder work surface such a fine finish that it prevents good lubrication, for the simple reason that there is no sufficient roughness—mainly little presence of valleys—for accumulating oil, giving rise to an almost dry work surface and premature wear of the film. This situation is aggravated by the fact that the hard carbon film is not porous, which impairs the lubrication, increasing the premature wear of the film. The application of this technical solution will be even more disadvantageous on an engine that operates on Diesel cycle, since the work pressures are significantly higher.

Document EP1510594 also discloses a cylinder of an internal combustion engine, the internal peripheral surface of which receives a hard carbon film. Said film has thickness ranging from 0.3 µm and 2 µm and roughness lower than 0.1 µm for the parameter Ra, its hardness ranging from 1000 Hv to 3500 Hv. According to this document, roughness higher than Ra 0.1 µm may result in increase in the friction coefficient. As mentioned in the previous document, this solution presents, as a disadvantage, deficient lubrication due to the reduced roughness of the film, incapable of accumulating lubricating fluid properly, which leads to premature wear of the film, chiefly on internal combustion engines that operate under high pressures (higher than 6 MPa (60 bar).

In addition to the problems resulting from the prior-art technologies mentioned, it should be noted that excessive roughness of hard carbon film (higher than Rz 4.0 µm) also entails drawbacks. A high roughness generates cracks followed by delamination due to the high contact pressure between the roughness on the slide surfaces of the rings and pistons, which leads to the premature failure of the film.

FIG. 1 shows results of tests of engines with cylinders made of cast iron, provided with a hard carbon film on their internal peripheral surface. The surface roughness, FIGS. 1A and 1B, after coating with the diamond-like carbon (DLC) film WAS OF Rz 5.82 µm and Rz 5.84 µm, respectively, that is, higher than Rz 4.0 µm. FIG. 1C shows that after the tests the surface of the cylinder at its upper dead center (UDC/PMS) was completely worn, without the presence of the hard carbon film. Additionally, the region adjacent below the upper dead center exhibited film delamination. The result of such tests showed clearly that roughness of cylinders with hard carbon films higher than Rz 4.0 µm undergo premature failure of the film, and so one should not exceed this roughness value.

It should be noted that the upper dead center (UDC) (see FIGS. 7A and 8) is the highest position, defined on the cylinder or liner, of the stroke of the piston rings (see FIGS. 7A, 7B and 8) with a diameter D. At the UDC position, an inversion of relative movement takes place on the first groove wing. This is the most stressed liner region, as far as wear is concerned, and a depression that can be observed as polishing of this region due to wear is generally formed, mainly in the case of engines that undergo greater pressures like those operating on Diesel, thus enhancing the formation of callus. Of course, in opposition to the upper dead center (UDC), there is the lower dead center (LDC), which, in the particular case of FIG. 7A and 7B, describes a compression rate in the piston-cylinder system. Thus, there is still no cylinder provided with a hard carbon film capable of finding a balance condition between the film roughness, friction coefficient and film wear and that overcomes the problems existing in the prior-art technologies, guaranteeing long durability in any internal combustion engine at a reduced cost.

SUMMARY

Therefore, it is an objective of the present invention to provide a cylinder for any type of internal combustion engine, having a body of ferrous base, the internal peripheral surface of which is provided with a diamond-like amorphous hard carbon (DLC) film with roughness ranging from Rz 0.5 µm and Rz 4.0 µm.

It is also an objective of the invention to provide a cylinder having a ferrous base, the internal peripheral surface of which is provided with a hard carbon film, the work surface of which comprises at least 99% carbon and hydrogen, which may present, below the work (slide) surface, chemical elements to improve the film adherence, for example, Cr, W, Si, SiC, without being limited to these. It is a further objective of the invention to provide a cylinder having a body of ferrous base, the internal peripheral surface of which is provided with a hard carbon film having hardness between 1000 Ha and 3000 Hv and thickness between 1 µm and 30 µm.

Finally, an objective of the invention is to provide a cylinder having a ferrous base, the internal peripheral surface of which is provided with a hard carbon film, the deposition of which is carried out by any chemical vapor deposition (CVD) method.

The objectives of the present invention are achieved by providing a cylinder for application on an internal combustion engine, the cylinder comprising a metallic cylindrical body and a diamond-like hard carbon (DLC) film, formed on the internal peripheral surface of the cylindrical body, the cylinder having roughness between Rz 0.5 µm and Rz 4.0 µm after formation of the carbon film.

BRIEF DESCRIPTION OF THE DRAWINGS

The present invention will now be described in greater detail with reference to examples of embodiments represented in the drawings. The figures show.

DETAILED DESCRIPTION

Figure 6:
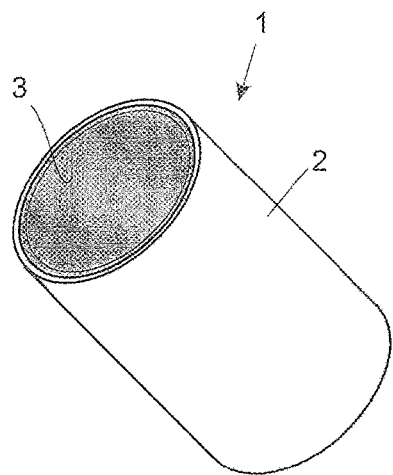
FIG. 6 is an illustration of a cylinder according to the present invention.
Figure 7A:
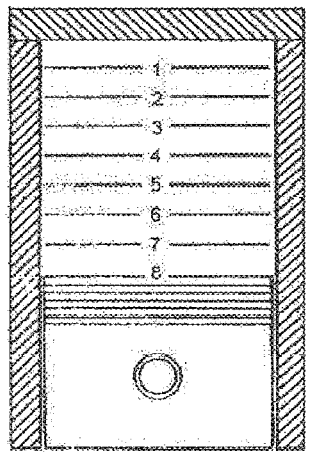
FIG. 7A is an illustration of the lower dead center (LDC) in the piston-cylinder system.
Figure 7B:
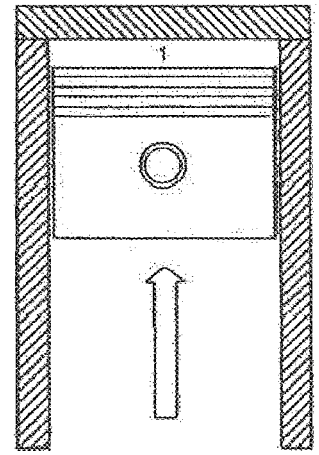
FIG. 7B is an illustration of the upper dead center (UDC) in the piston-cylinder system.
Figure 8:
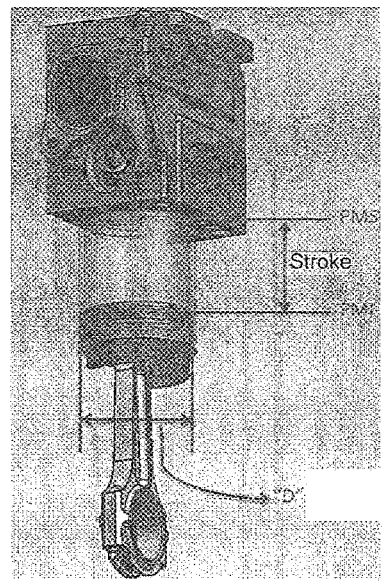
FIG. 8 is an illustration of the lower dead center (LDC), upper dead center (UDC) and the respective stroke of the piston-cylinder system.

The present invention foresees improvements on the cylinders 1 or cylinder liners of internal combustion engines. As said before, the present invention has application on both cylinders 1 and cylinder liners. For the sake of simplicity, hereinafter only the term cylinder 1 will be used, which will be metallic, ferrous or non-ferrous, for instance made of gray cast iron, aluminum or any other material that is suitable (see FIG. 6).

Even though there are already cylinders made of ferrous alloys provided with hard carbon films, for the sake of cost and durability of the cylinders, the most employed solution continues to be that of cast-iron cylinders without any coating on the work surface, this solution being applied chiefly on engines that operate under great pressure, such as the Diesel-cycle engines, where pressures ranges, as a rule, from 50 bar (6 MPa) and 200 bar (20 Mpa). Anyway, it should be noted that the present invention has application in any type of internal combustion engine (gasoline, ethanol or diesel), in any power or pressure regime.

Figure 3:
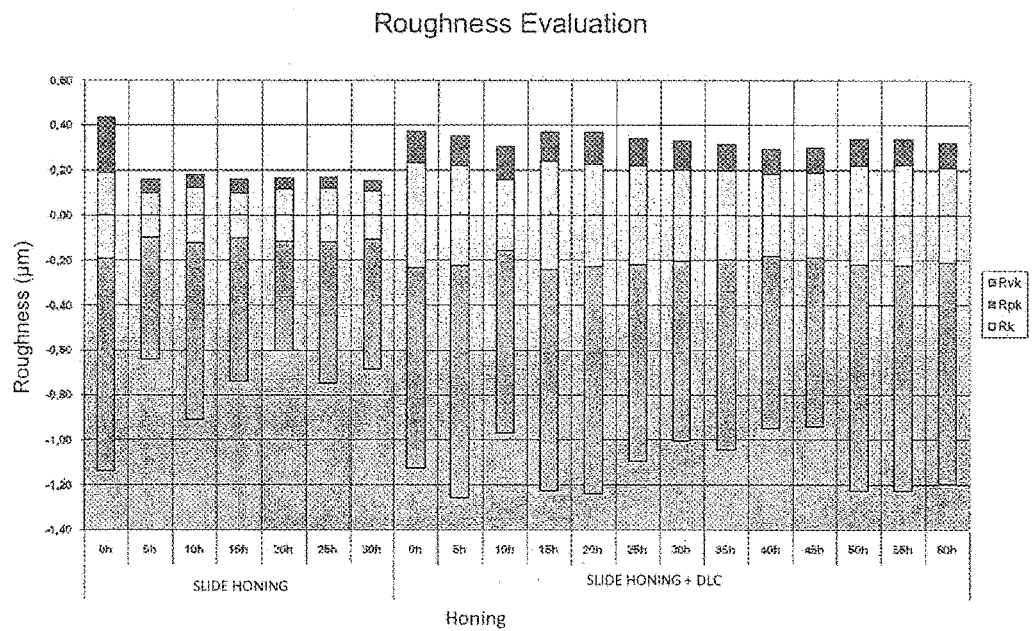
FIG. 3 is a graph comparing the roughness and wear between a conventional cast-iron cylinder and a cast-iron cylinder according to the present invention.

FIG. 3 enables one to understand the influence of roughness with hardness of the work surface of the cylinder to achieve an improvement in the durability requirement.

The graph of FIG. 3 compares the tests carried out between two different cylinders. At a first moment, one tests a prior-art cylinder, that is, a cast-iron cylinder without any coating on the work surface, this surface only receiving a polishing finish. At a second moment, one test a cylinder 1 according to the present invention, made from cast iron, where the internal peripheral portion of the cylinder body 2 receives polishing finish, followed by a hard carbon film 3.

The graph shows clearly that the prior-art cylinder undergoes softening of the work surface in the first five hours' test. This result is only possible because the work surface is soft enough to enable such a softening. Moreover, said softening remains reasonably stable during the thirty hours which the test lasted, resulting in a surface with better friction coefficient than the initial one. In this way, the wear of the prior-art cylinders proves to be beneficial because it leads to thinner roughness.

Further with reference to the first test, it should be reported that the softening of the surface had a particular impact on the roughness profile. Considering that the graph presents Rpk values (average roughness of the peaks) and Rvk (average roughness of the valleys), it is possible to conclude that the phenomenon of softening the cylinder had greater impact on the decrease in roughness of the peaks than the roughness of the valleys. Thus, the work surface has undergone a transformation of the roughness profile in which the peaks decreased from 0.40 µm to somewhat less than 0.20 µm.

On the other hand, the behavior of the work surface of the cylinder 1 of the present invention is quite different. The hard carbon film 3 causes such an increase in the hardness of the work surface that the phenomenon of softening may be considered virtually null during the sixty hours' test carried out. This is evidenced by the Rpk values, which range from 0.20 µm to 0.40 µm throughout the test. The same thing happens with the valley depth, so that one can conclude that, due to the hardness of the work surface, the cylinder does not undergo virtually any alteration in the roughness profile.

However, it should be noted that such a behavior is justified by the fact that the roughness of the cylinder according to the present invention has, before the beginning of the test, a thinner roughness than that existing in the prior art. It should also be understood that the thinner roughness of the present invention implies a differentiated roughness profile, balanced by a relationship between the peak roughness (Rpk) and the valley rogosity (Rvk).

Therefore, it should be noted that the profile of the peaks of the work surface is of utmost relevance to the durability of the hard carbon film 3 on the work surface of the cylinder 1. In this regard, a surface with very marked peaks generates cracks, followed by delamination due to the high contact pressure, causing premature failure of the film 3.

On the other hand, since the hard carbon film 3 follows the roughness profile of the internal peripheral surface of the cylinder body 2 and does not undergo softening by virtue of its high hardness, it is necessary to deposit the film 3 onto a work surface whose roughness profile of the peaks is reduced. In this way, the polishing finish that takes place before the deposition of the film 3 is carried out so as to decrease the peaks of the cylinder 1 to values that prevent premature deterioration of the hard carbon film 3. In this way, one achieves a cylinder having a hard carbon film 3 that is softened from the zero moment and, therefore, has an optimized friction coefficient. Such optimization results from both the reduced peak profile and the fact that the hard carbon film has low friction as an intrinsic characteristic.

Figure 4A:
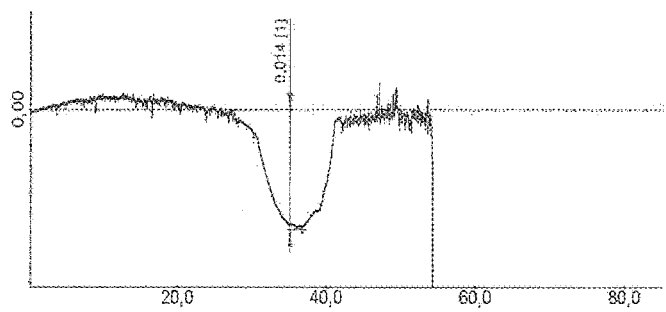
FIG. 4A is a graph showing the wear on a prior-art cylinder.
Figure 4B:
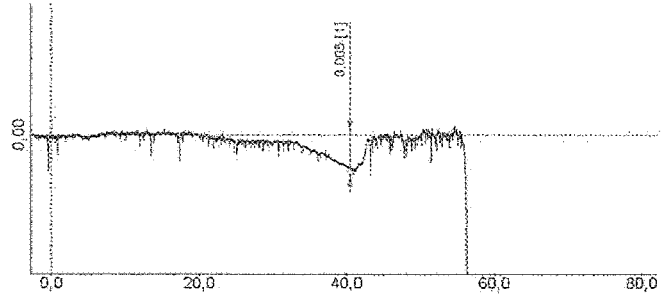
FIG. 4B is a graph showing the wear on a cylinder according to the present invention.

FIGS. 4A and 4B illustrate this behavior by showing the wear of the tribological ring-cylinder pair. It should be noted that such wear is measured by profile measurement of the most stressed region of the liner, before and after the test carried out on a heavy diesel 6-cylinder engine with power of 400-520 hp.

FIG. 4A shows the wear on a prior-art cylinder/liner without any DLC coating. FIG. 4B, in turn, shows the wear on a cylinder/liner according to the present invention with the DLC coating.

As a result, one observes a wear of 14 µm on the prior-art cylinder at the upper dead center of the cylinder (see FIG. 4A), whereas for the cylinder of the present invention, provided with a DLC film 3, one achieved wear of 5 µm (see FIG. 4B), that is, a wear 65% lower than that found in the prior art. This improvement results from an excellent resistance to wear of the coating according to the present invention. Additionally, one has achieved a low friction coefficient of the amorphous material (DLC) and the aid thereof in lubricating the assembly.

Another important observation refers to the fact that the polishing carried out in the present invention is capable of reducing the peak profile without the need to cause alteration in the depth of valleys. As mentioned before, the valley depth is important to promote accumulation of the lubricating fluid. This characteristic gains special importance due to the fact that the hard carbon film 3 is not porous, and it is necessary to guarantee roughness ranging from Rz 0.5 to Rz 4.0 µm, which is guaranteed mainly by a roughness profile with greater valley depth and lower peak height. It should be noted that the roughness values are measured after deposition of the hard carbon film 3 onto the internal peripheral surface of the cylinder body 2.

The values Rz 0.5 µm and Rz 4.0 µm should be met for the reasons already explained. On the one hand, values lower than Rz 0.5 µm do not guarantee a texture capable of guaranteeing a sufficient amount of lubricating fluid, causing a virtually dry-work condition, which is very harmful and leads to premature wear of the coating. On the other hand, values higher than Rz 4.0 µm will exhibit premature failure of the coating (FIGS. 1A, 1B and 1C), generating cracks and delamination of the film 3 due to the severity of the contact pressures of a hard coating deposited onto a soft substrate.

Thus, the roughness of the hard carbon film 3 comprises more valleys than peaks. An order of magnitude of the correlation between the average valley roughness (Rvk) and the average peal roughness (Rpk) can be achieved in the following way, as already explained before. The average valley roughness (Rvk) should be at least three times as high as the average peak roughness (Rpk).

Figure 1A:
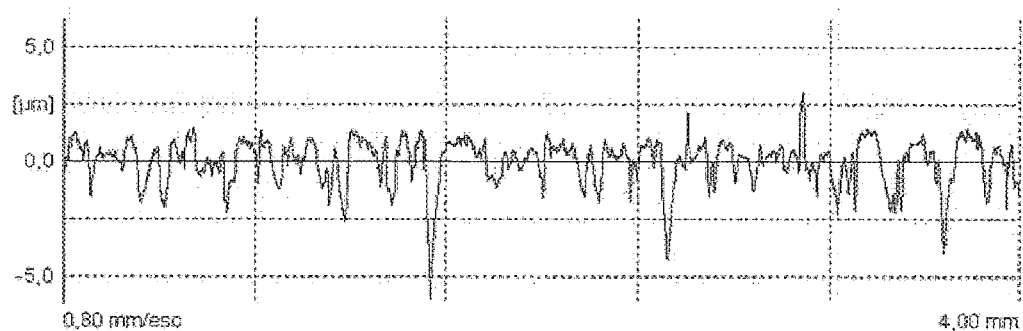
FIG. 1A is the result of a test of an engine with a cast-iron cylinder provided with a hard carbon film having roughness higher than Ra 4.0 µm.
Figure 1B:
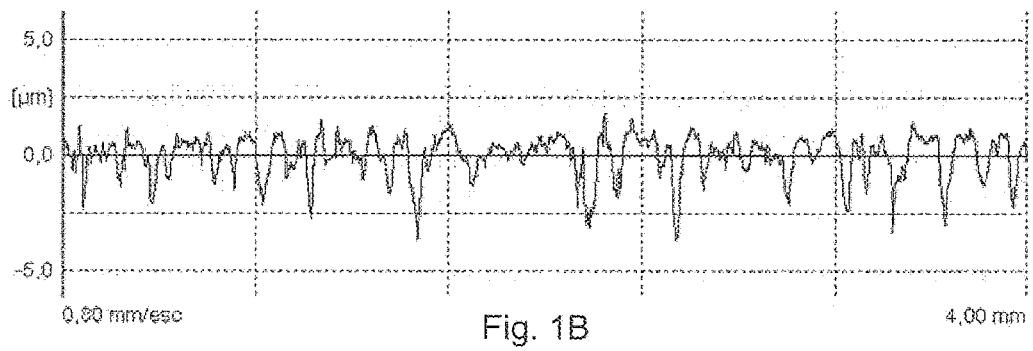
FIG. 1B is the result of a test with an engine with a cast-iron cylinder provided with a hard carbon film having roughness higher than Rz 4.0 µm.
Figure 1C:
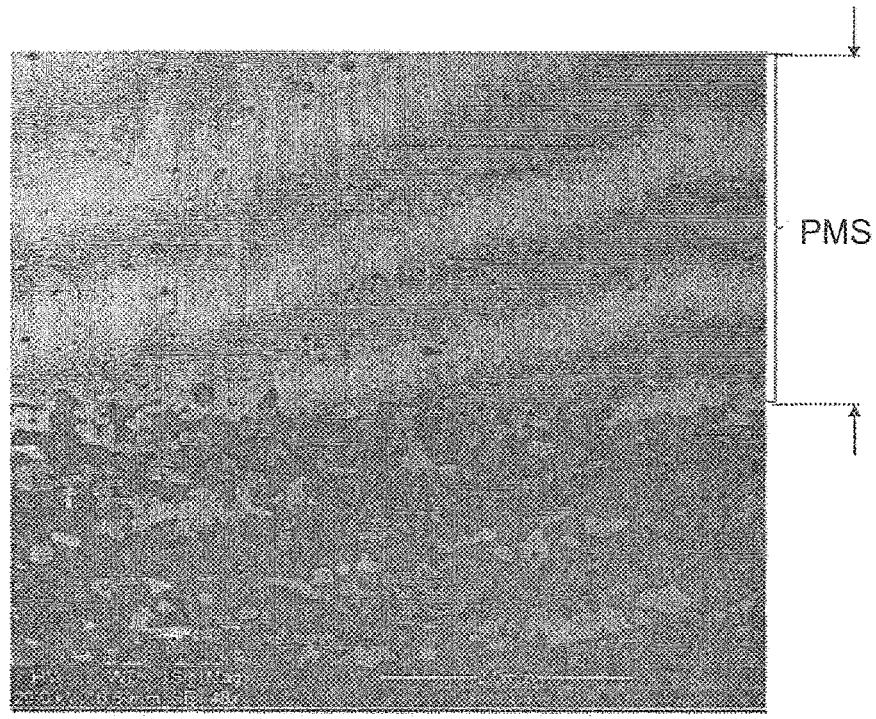
FIG. 1C is a microphotograph of the work surface of a cylinder having roughness higher than Rz 4.0 µm after completion of a test.

A comparative analysis of FIGS. 1A, 1B with FIGS. 2A, 2B, 2C and 2D enable one to understand easily the differences between a roughness profile of the prior art and that of the present invention. The table below shows clearly the differences in average roughness (Rz), average peak roughness (Rpk), average valley roughness (Rvk) and average center roughness (Rk).

TABLE 1

Roughness profile of the prior art compared with the present invention.

Figure 2A:
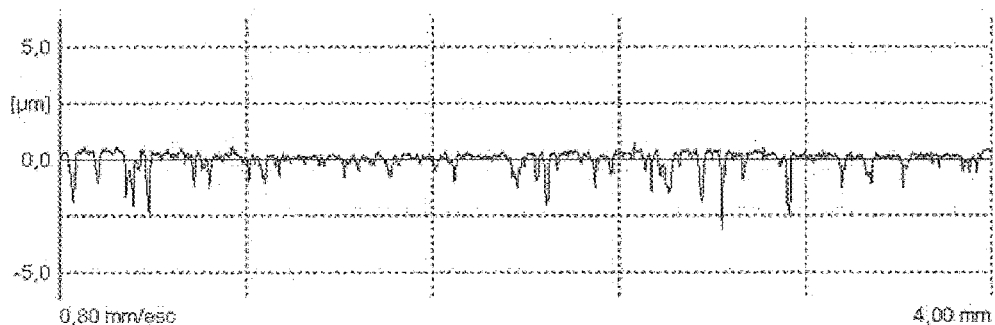
FIG. 2A is the result of a test of an engine with a cylinder according to the present invention.
Figure 2B:
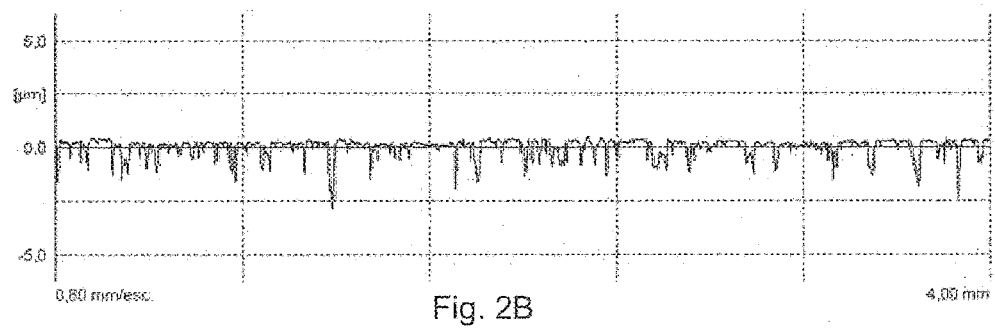
FIG. 2B is the result of a test of an engine with a cylinder according to the present invention.
Figure 2C:
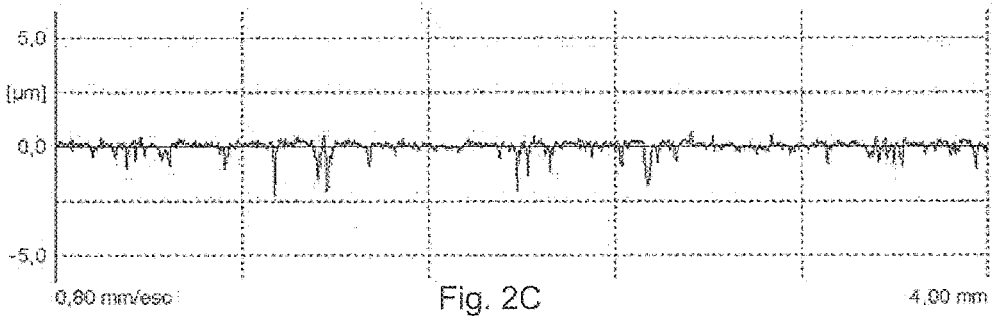
FIG. 2C is the result of a test of an engine with a cylinder according to the present invention.
Figure 2D:
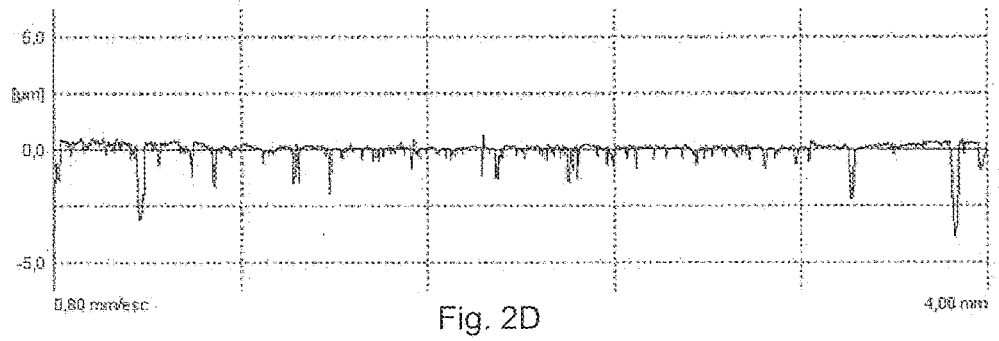
FIG. 2D is the result of a test of an engine with a cylinder according to the present invention.

| Roughness | FIG. 1A - prior art | FIG. 1B - prior art | FIG. 2A Present invention | FIG. 2B Present invention | FIG. 2C Present invention | FIG. 2D Present invention |
|---|---|---|---|---|---|---|
| Rz | 5.82 µm | 5.24 µm | 3.34 µm | 3.50 µm | 2.51 µm | 2.73 µm |
| Rpk | 0.66 µm | 0.59 µm | 0.15 µm | 0.26 µm | 0.05 µm | 0.17 µm |
| Rk | 2.16 µm | 2.23 µm | 0.69 µm | 0.74 µm | 0.18 µm | 0.43 µm |
| Rvk | 1.67 µm | 1.58 µm | 1.30 µm | 1.63 µm | 0.66 µm | 0.90 µm |
| 3 Rpk | 1.98 | 1.77 | 0.45 | 0.78 | 0.15 | 0.51 |

Comparing the present invention with the prior art, one observes that the present invention exhibits, as a characteristic, an average peak roughness (Rpk)=see FIGS. 2A, 2B, 2C, 2D—markedly lower than the average peak roughness (Rpk) found in the prior art—see FIGS. 1A, 1B.

In other words, the present invention is characterized by comprising an average valley roughness (Rvk) substantially higher than the average peak roughness (Rvk). By quantifying this relationship between the average valley roughness (Rvk) and the average peak roughness (Rpk), one can say that the average valley roughness (Rvk) is at least three times as high as the average peak roughness (Rpk). Such a relationship, for the present invention, can be translated by the following equation: Rvk>3 Rpk or 3 Rpk<Rvk.

It is worth mentioning that the polishing is a common practice in finishing cylinder surfaces for internal combustion engines. Anyway, it is common to carry out only one polishing step. The solution found for the roughness profile of the present invention was achieved with one more polishing step. One can consider that the first polishing step promotes a conventional finish to the roughness level, while the subsequent polishing steps have the objective of reducing the average peak roughness (Rpk), providing a cylinder 1 with a roughness profile suitable for receiving the hard carbon film 3.

The coating of a cylinder 1 with an amorphous diamond-like hard carbon (DLC) film 3 after more than one polishing step is an innovative concept that generates advantages at the wear level and reduction of the friction coefficient of the work surface of the cylinder 1.

It should be further noted that, after at least one polishing step, the polishing angle should be between 40 and 150 degrees.

With regard to the hard carbon film 3, known as amorphous diamond-like carbon (DLC), it is important to mention that the DLC film 3 of the present invention comprises SP3 bonds and also SP2 bonds (graphite), but the SP3 bonds are the majority.

Additionally, the hard carbon film 3 exhibits a work surface containing only carbon (C) and hydrogen (H2), and other elements in amount lower than 1% may be present, which, given the reduced amount, will be considered residual contamination. Thus, one provides a cylinder having a body of ferrous base, the internal peripheral surface of which comprises a DLC film 3, the work surface of which comprises at least 90% carbon and hydrogen. Anyway, below the work (slide) surface, the film 3 may, preferably but not compulsorily, exhibit chemical elements to provide better adherence, for example Cr, W, Si, SiC, or any others that prove to be feasible.

With regard to the thickness of the DLC film 3, it will range from 1 µm and 30 µm. Finally, the hardness of the work surface of the cylinder 1 of the present invention will range from 1000 Hv to 3500 Hv.

It should be noted that the cylinder achieved by the present invention has, as an additional advantage, the fact that it can be used on any type of internal combustion engine (gasoline, ethanol or diesel). One of the advantages is achieved by virtue of the fact that it bears work pressures higher than about 200 bar, which enables application thereof to engines with specific output power higher or lower than 52KW1-I.

Additionally, the solution achieved is interesting, since it prevents the need to soften the engine cylinders, proving a "softened" behavior right at the first hours of operation of the engine, because the initial roughness is controlled so as to minimize the roughness of the surface, starting from a value corresponding to the already softened value from the beginning.

Figure 5:
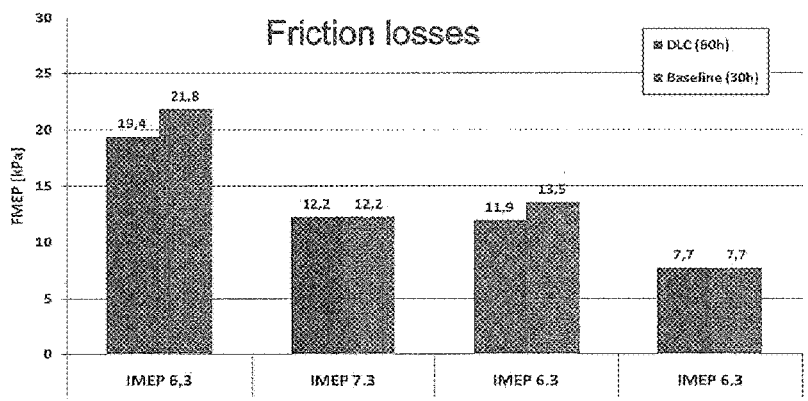
FIG. 5 is a graph comparing the loss by friction between a conventional cast-iron cylinder and a cast-iron cylinder according to the present invention.

Further with regard to the benefits resulting from the present invention, one should observe FIG. 5, which presents the losses due to friction of the prior-art cylinders and those of the present invention.

The measurements of tests for friction were carried out on a single-cylinder engine, wherein the liner is mounted on force measuring sensors so as to enable one to read the friction force generated by the sliding of rings and pistons on the inner surface of the cylinder 1. The tests were carried out with an accuracy level sufficient to enable differentiation in the friction reading, even when there are minor modifications in the components to be tested. The friction was measured in 5 operational conditions for each operation angle of the crankshaft: i) 1500 rpm @BMEP OF 380 kPa; ii) 1500 rpm @BMEP 500 kPa; iii) 1500 rpm @BMEP 630 kPa; iv) 2500 rpm @500 kPa and v) 2500 rpm @ 500 kPa, as detailed in the table below:

TABLE 1

| Cylinder displacement characteristics | |
|---|---|
| Types of engine | Single-cylinder, 4 strokes SI gasoline |
| Displacement (I) | 0.499 |
| Bore × Stroke (mm) | 86 × 86 |
| Compression rate | 10:1 |
| Rod/Stroke crankshaft (L/R) | 3.5 |
| Operating conditions (velocity and BMEP) | 1500 rpm @ 380, 500, 630 KPa |
| | 2000 rpm @ 500 KPa |
| | 2500 rpm @ 500 KPa |
| Type of oil | SAE 5W-30 SL/GF-3 class |
| Cylinder temperature (° C.) | 100 (at mid-stroke) |
| Oil temperature (° C.) | 85 (in the main gallery) |

According to the results obtained, even though the roughness of prior-art cylinders is lower than that of the present invention (see FIG. 3), the cylinders 1 of the present invention exhibit lower loss by friction than those of the prior art, resulting in greater transmission of energy to the crankshaft.

In this way, the present invention manages to achieve a cylinder 1 that guarantees excellent work conditions. On the one hand, this result comes from the preparation of the substrate that will receive the coating, the roughness profile of which has the contact-pressure generating peaks eliminated, and guarantees the presence of the valleys for accumulation of the lubricating oil film. Additionally, the coating with a hard carbon film 3 minimizes the losses by friction and the wear of the component, thus guaranteeing longevity and low friction coefficient of the engine.

It is evident that the present invention is only achieved with a virtually pure carbon and hydrogen coating, which, besides the characteristics already mentioned, comprises a cylinder whose work surface has roughness ranging from Rz 0.5 µm to Rz 4.0 µm. More particularly, the roughness of the hard carbon film 3 copies exactly the roughness of the metallic substrate and, finally, the roughness after application of the film 3 will range from Rz 0.5 µm and Rz 4.0 µm.

Finally, it should be noted that the solution found manages to couple excellent properties to reduced cost, enabling any type of internal combustion engine to obtain the benefits of the present invention.

Preferred examples of embodiments having been described, one should understand that the scope of the present invention embraces other possible variations, being limited only by the contents of the accompanying claims, which include the possible equivalents.

The invention claimed is:

1. A cylinder for an internal combustion engine, comprising:
   a metallic cylinder body; and
   an amorphous diamond-like hard carbon film disposed on an internal peripheral surface of the cylinder body, wherein:
      the amorphous diamond-like carbon film includes a thickness ranging from 1 µm to 30 µm;
      the amorphous diamond-like carbon film includes a roughness ranging from Rz 0.5 µm to Rz 4.0 µm; and the roughness of the amorphous diamond-like carbon film includes valleys and peaks, the valleys having an average valley roughness that is between five and thirteen times higher than an average peak roughness of the peaks.

2. The cylinder according to claim 1, wherein the internal peripheral surface of the cylinder body receives a surface finish in at least two polishing steps before receiving the amorphous diamond-like carbon film.

3. The cylinder according to claim 2, wherein the polishing angle ranges from 40 to 150 degrees.

4. The cylinder according to claim 3, wherein a hardness of the amorphous diamond-like carbon film ranges from 1000 Hv to 3000 Hv.

5. The cylinder according to claim 2, wherein the cylinder body is constituted by ferrous metal.

6. The cylinder according to claim 2, wherein a hardness of the amorphous diamond-like carbon film ranges from 1000 Hv to 3000 Hv.

7. The cylinder according to claim 1, wherein the amorphous diamond-like carbon film includes a hardness ranging from 1000 Hv to 3000 Hv.

8. The cylinder according to claim 1, wherein a work surface of the amorphous diamond-like carbon film includes at least 99% of carbon or carbon and hydrogen.

9. The cylinder according to claim 1, wherein the cylinder body is composed of a ferrous metal.

10. A cylinder for an internal combustion engine, comprising:

a metallic cylinder body having an internal peripheral surface;

an amorphous diamond-like carbon film disposed on the internal peripheral surface, the amorphous diamond-like carbon film including a roughness ranging from Rz 0.5 μm to Rz 4.0 μm, the roughness including valleys and peaks, wherein:

the valleys include an average valley roughness that is between five and thirteen times greater than an average peak roughness of the peaks;

the amorphous diamond-like carbon film includes a hardness ranging from 1000 Hv to 3000 Hv and a thickness between 1 μm and 30 μm; and the amorphous diamond-like carbon film includes a thickness ranging from 1 μm to 30 μm.

11. The cylinder according to claim 10, wherein the internal peripheral surface is treated in at least two honing steps prior to receiving the amorphous diamond-like carbon film.

12. The cylinder according to claim 11, wherein the honing angle ranges from 40 to 150 degrees.

13. The cylinder according to claim 10, wherein the cylinder body is composed of a ferrous metal.

14. The cylinder according to claim 10, wherein the amorphous diamond-like carbon film has a work surface including at least 99% of carbon or carbon and hydrogen.

* * * * *